(12) United States Patent
Rasalingam et al.

(10) Patent No.: US 12,349,278 B2
(45) Date of Patent: Jul. 1, 2025

(54) SELF-GUIDED PLACEMENT OF MEMORY DEVICE COMPONENT PACKAGES

(71) Applicant: Western Digital Technologies, Inc., San Jose, CA (US)

(72) Inventors: Uthayarajan A/L Rasalingam, Nibong Tebal (MY); Alexander Beh, Nibong Tebal (MY)

(73) Assignee: Sandisk Technologies, Inc., Milpitas, CA (US)

( * ) Notice: Subject to any disclaimer, the term of this patent is extended or adjusted under 35 U.S.C. 154(b) by 692 days.

(21) Appl. No.: 17/527,687

(22) Filed: Nov. 16, 2021

(65) Prior Publication Data

US 2023/0156921 A1 May 18, 2023

(51) Int. Cl.
*H05K 1/18* (2006.01)
*H01L 23/00* (2006.01)

(52) U.S. Cl.
CPC .............. *H05K 1/181* (2013.01); *H01L 24/16* (2013.01); *H01L 2224/10135* (2013.01); *H01L 2224/16225* (2013.01); *H01L 2924/1438* (2013.01); *H05K 2201/09827* (2013.01); *H05K 2201/10159* (2013.01)

(58) Field of Classification Search
CPC .......... H05K 1/18; H05K 1/181; H01L 24/16; H01L 2224/10135; H01L 2224/16225; H01L 2924/1438
USPC ........................................................ 361/802
See application file for complete search history.

(56) References Cited

U.S. PATENT DOCUMENTS

| | | | |
|---|---|---|---|
| 2016/0183374 A1* | 6/2016 | Prakash | H01L 23/498 361/767 |
| 2018/0183161 A1* | 6/2018 | Soyano | H01R 43/205 |

* cited by examiner

*Primary Examiner* — Tremesha W Burns
(74) *Attorney, Agent, or Firm* — Michael Best & Friedrich LLP (57) ABSTRACT

A data storage device includes a substrate and one or more grid array integrated circuit packages. The grid array integrated circuit package includes at least one self-alignment pin having a tapered shape. The substrate includes one or more connection pads to receive the grid array integrated circuit packages. The connection pads include at least one self-alignment receptacle that receives the self-alignment pins such that the grid array integrated circuit packages maintain an alignment with an associated connection pad of the substrate.

16 Claims, 6 Drawing Sheets

SELF-GUIDED PLACEMENT OF MEMORY DEVICE COMPONENT PACKAGES

BACKGROUND

This application relates generally to integrated circuit component placement, and specifically to grid array-based integrated circuit component placement.

The current trend in packaged integrated circuits ("IC"), such as those used memory devices (for example, SD cards, micro SD cards, USB devices and the like) is to increase component density while also maintaining or reducing packaging size. As packaging sizes are reduced, and/or component density increased, the quantity of connection points increases, and the pitch or distance between these points decreases. For grid array-based components, these decreased pitches allow minimal room for positioning errors during placement and soldering. The concepts described herein allow for grid array-based components to be self-aligning to reduce positioning errors during assembly.

SUMMARY

Increases in component density within solid state components (e.g. NAND dies, Application Specific Integrated Circuits ("ASIC"), etc.) and/decreasing package sizes requires additional connection points on components and/or finer pitches between the connection points. By providing self-aligning mechanisms within component packages, alignment and positioning issues can be reduced during assembly.

One embodiment of the present disclosure includes a data storage device. The data storage device includes a substrate and an integrated circuit package includes a grid array and at least one self-correcting alignment pin having a tapered portion. The substrate includes a connection pad interfacing with the integrated circuit package. The connection pad includes at least one self-correcting alignment receptacle receiving the at least one self-correcting alignment pin.

Another embodiment of the present disclosure includes an integrated circuit device. The integrated circuit device includes a package having a quadrilateral shape and a grid array positioned on a first side of the package. The grid array includes a number of connection points. The integrated circuit further includes a first self-correcting alignment pin on the first side of the package and a second self-correcting alignment pin on the first side of the package. The first self-correcting alignment pin and the second self-correcting algorithm alignment pin have a conically shaped tapered portion and the first self-correcting alignment pin and the second self-correcting alignment pin are positioned opposite the grid array along a diagonal axis bisecting the package.

Another embodiment of the present disclosure includes an electronic assembly. The electronic assembly includes a printed circuit board and an integrated circuit package having a grid array. The integrated circuit package includes a first self-correcting alignment pin having a tapered shape and a second self-correcting alignment pin. The first self-correcting alignment pin and the second self-correcting alignment pin have a tapered portion. The printed circuit board includes a connection pad interfaced with the grid array integrated circuit package. The connection pad includes a first self-correcting alignment receptacle receiving the first self-correcting alignment pin and a second self-correcting alignment receptacle receiving the second self-alignment pin. The first self-correcting alignment pin and the second self-correcting alignment pin are received within the first self-correcting alignment receptacle and the second self-correcting alignment receptacle such that the grid array integrated circuit package maintains an alignment with the connection pad.

Various aspects of the present disclosure provide for improvements in memory devices. For example, increasing component density while maintaining or reducing current packaging dimensions allows for greater performance in smaller packages. The present disclosure can be embodied in various forms. The foregoing summary is intended solely to give a general idea of various aspects of the present disclosure and does not limit the scope of the present disclosure in any way.

DETAILED DESCRIPTION

In the following description, numerous details are set forth, such as data storage device configurations, and the like, in order to provide an understanding of one or more aspects of the present disclosure. It will be readily apparent to one skilled in the art that these specific details are merely exemplary and not intended to limit the scope of this application. The following description is intended solely to give a general idea of various aspects of the present disclosure and does not limit the scope of the disclosure in any way. Furthermore, it will be apparent to those of skill in the art that, although the present disclosure refers to NAND flash, the concepts discussed herein are applicable to other types of solid-state memory, such as NOR, PCM ("Phase Change Memory"), ReRAM, etc. Those of skill in the art also will realize that although the disclosure refers to a substrate used in a data storage device, the disclosure may apply to substrates used in other types of electronic devices. The disclosure applies to both substrates and printed circuit boards used in electronic devices. Further, although specific examples disclose memory devices, it will be understood by those of skill in the art that the inventive concepts disclosed herein may be applied to other types of electronic devices that are assembled using a printed circuit board.

Figure 1:
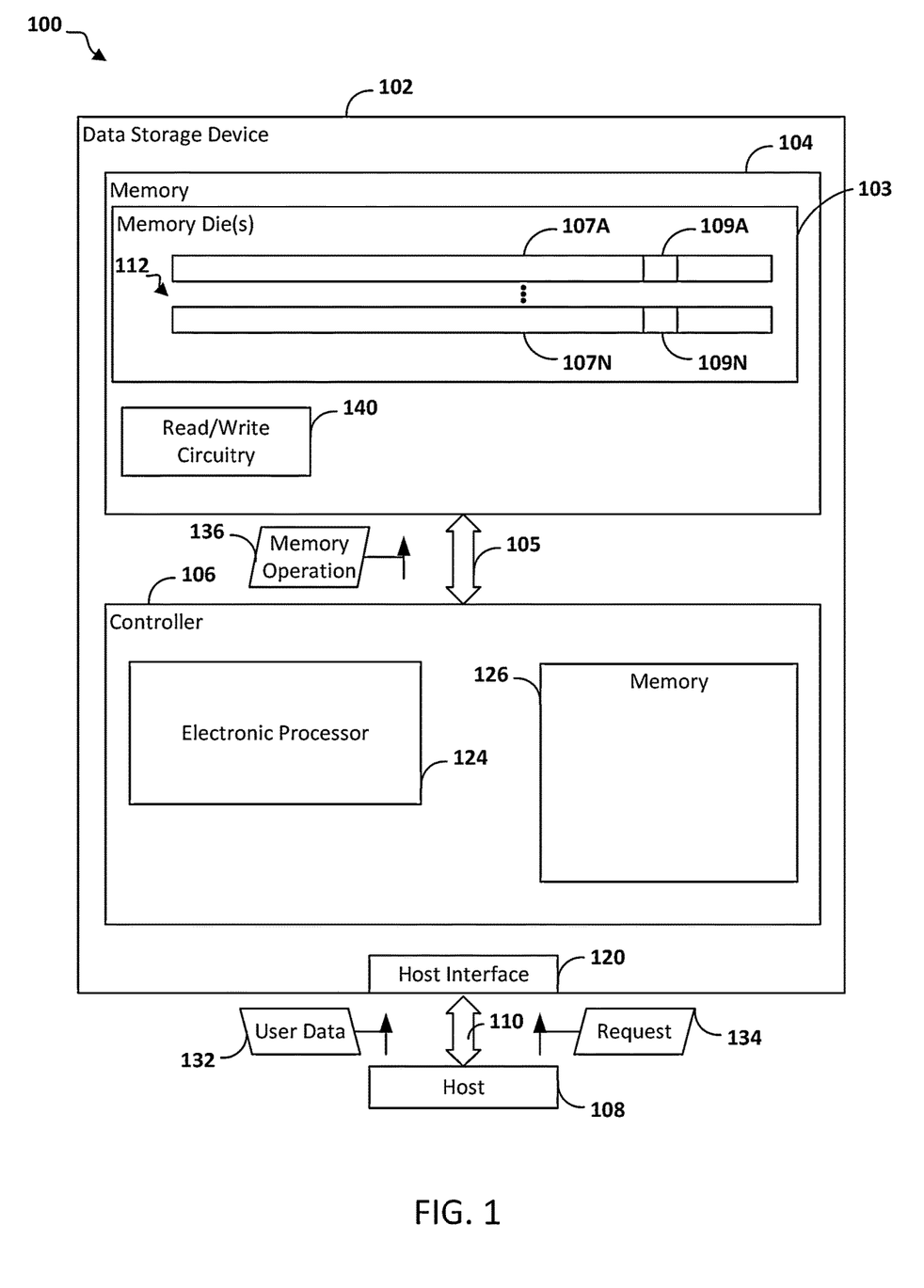
FIG. 1 is block diagram of one example of a system including a data storage device, according to some embodiments.

FIG. 1 is a block diagram of one example of a system 100 that includes a data storage device 102 in communication with a host device 108. The data storage device 102 includes a memory device 104 (e.g., non-volatile memory) that is coupled to a controller 106.

One example of the structural and functional features provided by the controller 106 are illustrated in FIG. 1. However, the controller 106 is not limited to the structural and functional features provided by the controller 106 in FIG. 1. The controller 106 may include fewer or additional structural and functional features that are not illustrated in FIG. 1.

The data storage device 102 and the host device 108 may be operationally coupled with a connection (e.g., a communication path 110), such as a bus or a wireless connection. In some examples, the data storage device 102 may be embedded within the host device 108. Alternatively, in other examples, the data storage device 102 may be removable from the host device 108 (i.e., "removably" coupled to the host device 108). As an example, the data storage device 102 may be removably coupled to the host device 108 in accordance with a removable universal serial bus (USB) configuration. In some implementations, the data storage device 102 may include or correspond to a solid state drive (SSD), which may be used as an embedded storage drive (e.g., a mobile embedded storage drive), an enterprise storage drive (ESD), a client storage device, or a cloud storage drive, or other suitable storage drives.

The data storage device 102 may be configured to be coupled to the host device 108 with the communication path 110, such as a wired communication path and/or a wireless communication path. For example, the data storage device 102 may include an interface 120 (e.g., a host interface) that enables communication with the communication path 110 between the data storage device 102 and the host device 108, such as when the interface 120 is communicatively coupled to the host device 108. In some embodiments, the communication path 110 may include one or more electrical signal contact pads or fingers that provide electrical communication between the data storage device 102 and the host device 108.

The host device 108 may include a processor and a memory. The memory may be configured to store data and/or instructions that may be executable by the processor. The memory may be a single memory or may include one or more memories, such as one or more non-volatile memories, one or more volatile memories, or a combination thereof. The host device 108 may issue one or more commands to the data storage device 102, such as one or more requests to erase data at, read data from, or write data to the memory device 104 of the data storage device 102. For example, the host device 108 may be configured to provide data, such as user data 132, to be stored at the memory device 104 or to request data 134 to be read from the memory device 104. The host device 108 may include a mobile smartphone, a music player, a video player, a gaming console, an electronic book reader, a personal digital assistant (PDA), a computer, such as a laptop computer or notebook computer, any combination thereof, or other suitable electronic device.

The host device 108 communicates with a memory interface that enables reading from the memory device 104 and writing to the memory device 104. In some examples, the host device 108 may operate in compliance with an industry specification, such as a Universal Flash Storage (UFS) Host Controller Interface specification. In other examples, the host device 108 may operate in compliance with one or more other specifications, such as a Secure Digital (SD) Host Controller specification or other suitable industry specification. The host device 108 may also communicate with the memory device 104 in accordance with any other suitable communication protocol.

The memory device 104 of the data storage device 102 may include a non-volatile memory (e.g., NAND, BiCS family of memories, or other suitable memory). In some examples, the memory device 104 may be any type of flash memory. For example, the memory device 104 may be two-dimensional (2D) memory or three-dimensional (3D) flash memory. The memory device 104 may include one or more memory dies 103. Each of the one or more memory dies 103 may include one or more memory blocks 112 (e.g., one or more erase blocks). Each memory block 112 may include one or more groups of storage elements, such as a representative group of storage elements 107A-107N. The group of storage elements 107A-107N may be configured as a wordline. The group of storage elements 107A-107N may include multiple storage elements (e.g., memory cells that are referred to herein as a "string"), such as a representative storage elements 109A and 109N, respectively.

The memory device 104 may include support circuitry, such as read/write circuitry 140 to support operation of the one or more memory dies 103. Although depicted as a single component, the read/write circuitry 140 may be divided into separate components of the memory device 104, such as read circuitry and write circuitry. The read/write circuitry 140 may be external to the one or more memory dies 103 of the memory device 104. Alternatively, one or more individual memory dies may include corresponding read/write circuitry that is operable to read from and/or write to storage elements within the individual memory die independent of any other read and/or write operations at any of the other memory dies.

The controller 106 is coupled to the memory device 104 (e.g., the one or more memory dies 103) with a bus 105, an interface (e.g., interface circuitry), another structure, or a combination thereof. For example, the bus 105 may include multiple distinct channels to enable the controller 106 to communicate with each of the one or more memory dies 103 in parallel with, and independently of, communication with the other memory dies 103.

The controller 106 is configured to receive data and instructions from the host device 108 and to send data to the host device 108. For example, the controller 106 may send data to the host device 108 using the interface 120, and the controller 106 may receive data from the host device 108 with the interface 120. The controller 106 is configured to send data and commands (e.g., the memory operation 136, which may be a cycle operation of a memory block of the memory device 104) to the memory device 104 and to receive data from the memory device 104. For example, the controller 106 is configured to send data and a program or write command to cause the memory device 104 to store data to a specified address of the memory device 104. The write command may specify a physical address of a portion of the memory device 104 (e.g., a physical address of a word line of the memory device 104) that is to store the data.

The controller 106 is configured to send a read command to the memory device 104 to access data from a specified address of the memory device 104. The read command may specify the physical address of a region of the memory device 104 (e.g., a physical address of a word line of the memory device 104). The controller 106 may also be configured to send data and commands to the memory device 104 associated with background scanning operations, garbage collection operations, and/or wear-leveling operations, or other suitable memory operations.

The controller 106 may include a processor 124, a memory 126, and other associated circuitry. The memory 126 may be configured to store data and/or instructions that may be executable by the processor 124.

The controller 106 may send the memory operation 136 (e.g., a read command) to the memory device 104 to cause the read/write circuitry 140 to sense data stored in a storage element. For example, the controller 106 may send the read command to the memory device 104 in response to receiving a request for read access from the host device 108. In response to receiving the read command, the memory device 104 may sense the storage element 107A (e.g., using the read/write circuitry 140) to generate one or more sets of bits representing the stored data.

Generally, one or more components of the data storage device 102, such as the memory devices 104 and/or the controller 106 are solid-state integrated circuit packages. These packages are coupled to a printed circuit board ("PCB") or other applicable substrates. Often a grid array component is used to maximize the connection points between the package and the substrate.

Figure 2:
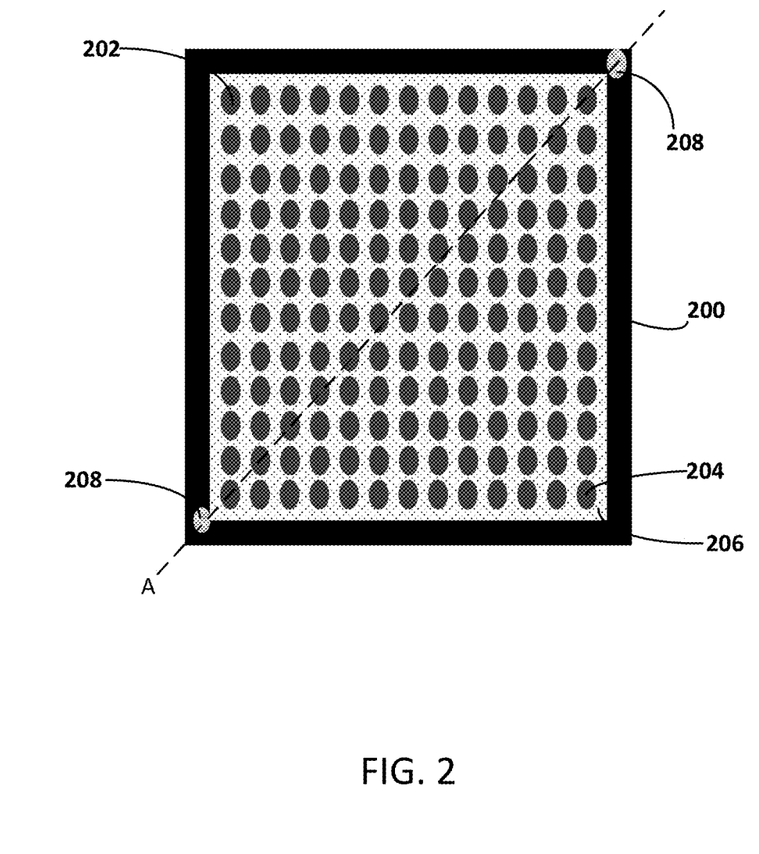
FIG. 2 is a top down view of an integrated circuit component, according to some embodiments.

Turning now to FIG. 2, a bottom view of an integrated circuit packaged component 200 having a grid array 202 on one side of the integrated circuit packaged component 200 is shown, according to some embodiments. In one embodiment, the grid array 202 is a ball grid array ("BGA"). However, other grid array types may be used, such as land grid arrays ("LGA"), pin grid arrays ("PGA"), or other grid array package, as required for a given application. The packaged component 200 may include one or more components of the data storage device 102, such as the memory device 104, the controller 106, and/or other components within the data storage device 102 as described above. Additionally, while the packaged component 200 is described with respect to the data storage device 102, the packaged component 200 may be used in various other devices, such as computing devices, other data storage devices, and/or other electronic devices which utilize one or more integrated circuit packaged components.

The grid array 202 includes a number of pins 204 covered with solder in the form of a solder ball 206. In some embodiments, the solder balls 206 are silver-tin solder. However, other solder types, such as tin-silver-copper, tin-copper, gold, tin-lead, and/or other solder types may be used as required for a given application.

The solder balls 206 on the grid array 202 are configured to interface with one or more corresponding points on a printed circuit board ("PCB"). For example, turning now to FIG. 3, a PCB 300 with multiple pads 302 configured to receive a grid array component, such as packaged component 200, is shown according to some embodiments. While described as pads, the pads 302 may be receptacles or other components configured to receive a grid array component. The PCB 300 generally includes a substrate material with various traces, connection pads, etc. printed or otherwise formed thereon. The substrate material may be fiberglass, alumina, Kapton, or other suitable substrate material. The pads 302 include a grid array 304 corresponding to the grid array of a packaged component, such as packaged component 200. The grid array 304 includes a number of connection points 305. The connection points 305 correspond to the pins 204 of a corresponding packaged component, such as packaged component 200. In one embodiment, the connection points 305 are made of a conductive material, such as copper, silver, gold, or other material required for a given application. In some embodiments, the pads may include flux or solder on the pad to improve coupling with the corresponding grid array of a packaged component.

Figure 4A:
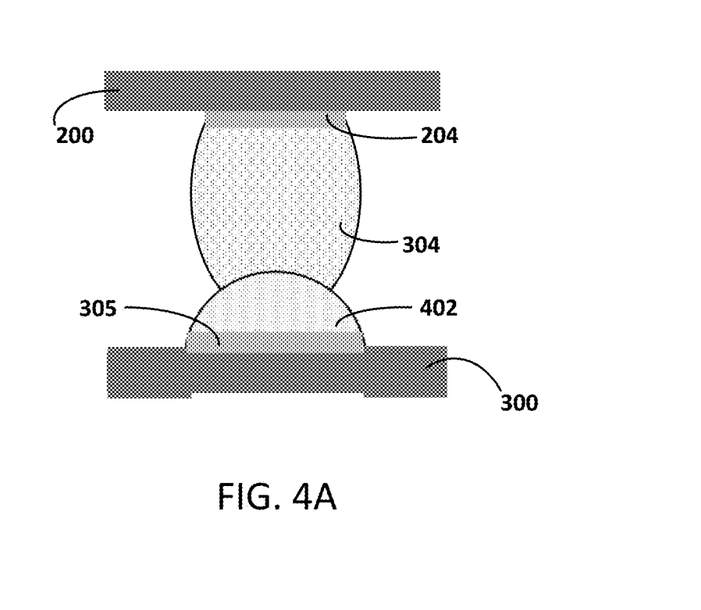
FIG. 4A is a side cross-sectional view of a properly aligned grid array component, according to some embodiments.

Turning now to FIG. 4A, a representation of a coupling of a pin 204 of the packaged component 200 with a connection point 305 of the PCB 300 is shown, according to some embodiments. As shown in FIG. 4A, the connection point 305 includes solder portion 402 which covers the connection pad. The pin 204 is directly aligned with the connection point 305, such that the solder ball 206 is in contact with the solder portion 402. During a manufacturing process, heat is applied to the PCB 300 and the packaged component 200, such that the solder ball 206 and the solder portion 402 reflow, thereby forming a solder joint between the pin 204 of the packaged component 200 and the connection point 305 of the PCB 300.

Figure 4B:
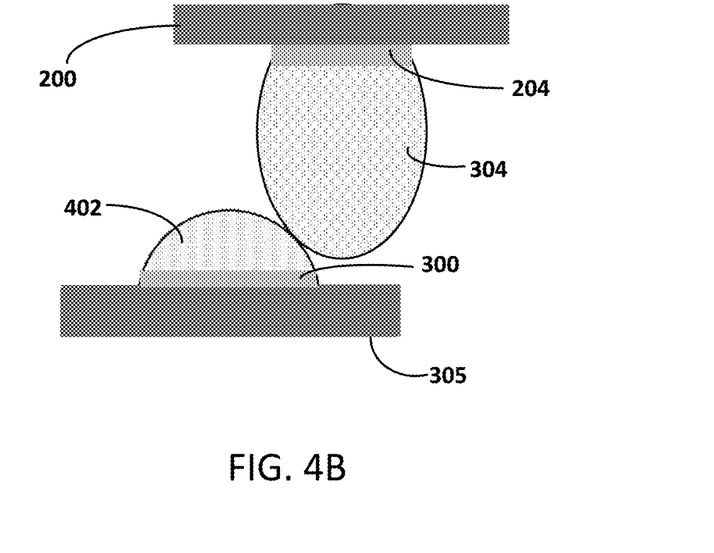
FIG. 4B is a side cross-sectional view of an improperly aligned grid array component, according to some embodiments.

However, in some instances, due to variations in component placement, vibrations, or other factors, a packaged component may be placed such that it is slightly misaligned with a pad of the PCB, resulting in the pins of the packaged component being slightly misaligned from the corresponding connection pads of the PCB. Turning now to FIG. 4B, a misalignment between the packaged component 200 and the PCB 300 is shown, according to some examples. Here, the packaged component 200 is slightly offset along a horizontal axis from the PCB 300. This results in a misalignment between the pin 204 and the corresponding connection point 305. While a solder joint may be formed during the manufacturing, due to the contact between the solder ball 206 and the solder portion 402, the offset in position could potentially result in the solder ball 206 reflowing and contacting a nearby second (or more) connection point 305 of the PCB 300. This may result in a device, such as data storage device 102, failing a production test, requiring the device to be reworked (e.g. removing the packaged component 200 and repositioning with the same or new packaged component), or discarded. The potential for connection to more than one connection point 305 is increased as the pitch (e.g. distance) between pins 204 on the packaged component 200 decreases.

Returning now to FIG. 2, the packaged component 200 further includes a pair of alignment pins 208. In some instances, the alignment pins may be referred to as self-correcting alignment pins. The alignment pins 208 may be metallic pins coupled to the packaged component 200. In one embodiment, the alignment pins 208 are made of a conductive material, such as gold, silver, copper, or other material appropriate for a required application. In other embodiments, the alignment pins 208 may be made of a non-metallic material, such as plastic, polymer, silicon, carbon fiber, etc. As shown in FIG. 2, the alignment pins 208 are generally located on opposite corners of a quadrilateral shaped packaged component 200. For example, the alignment pins 208 may be are located on opposite corners of the grid array 202 along a diagonal axis A which bisects packaged component 200. However, other positions of the alignment pins 208 are also contemplated. In some embodiments, one of the alignment pins 208 may be slightly offset at a different distance from an edge of the packaged component than a second alignment pin to prevent installation of the packaged component 200 in an improper orientation. Additionally, while the packaged component 200 is shown with two alignment pins 208, some embodiments may include more than two alignment pins 208. For example, some components may have four alignment pins 208 positioned in opposite corners of the packaged component.

Figure 3:
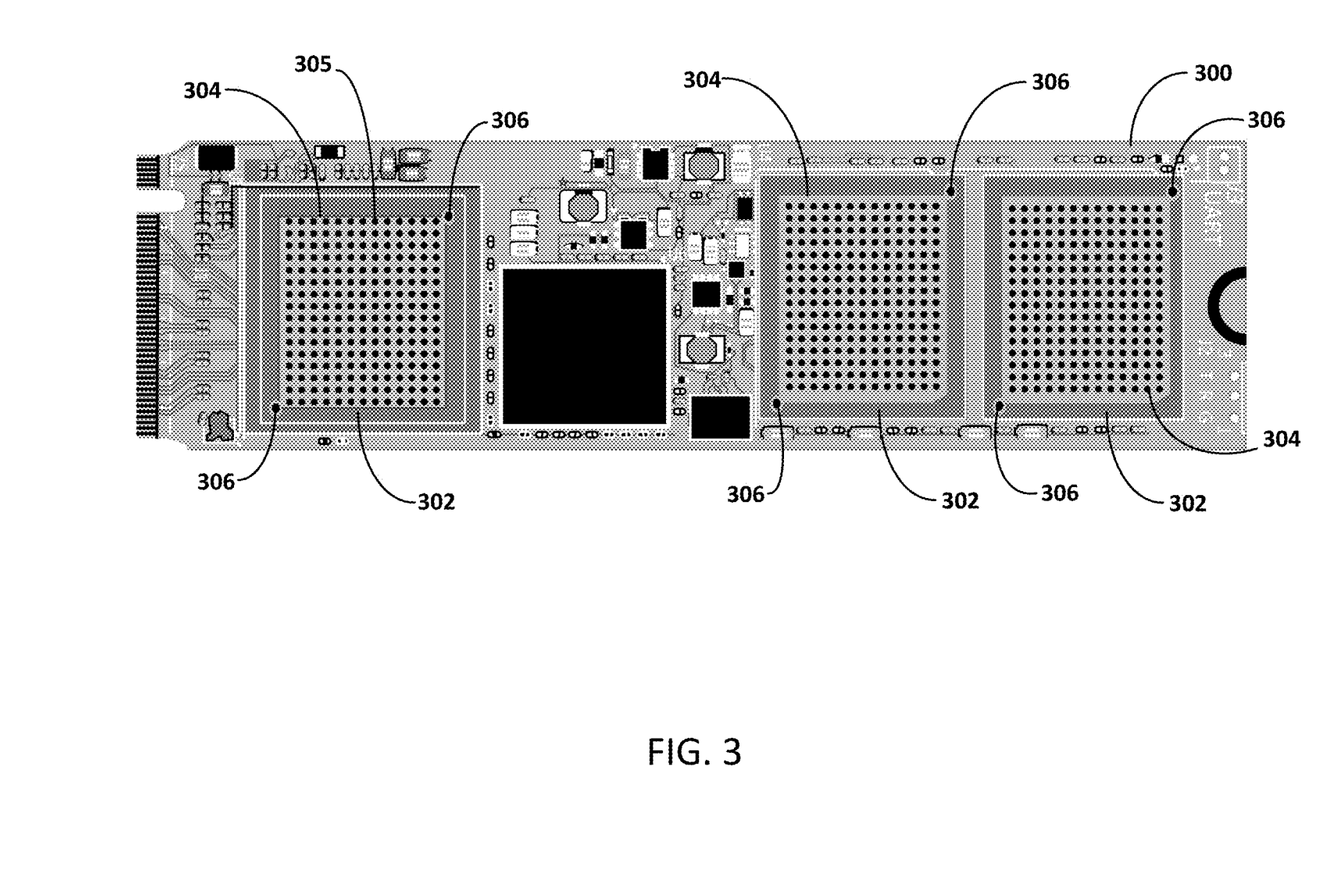
FIG. 3 is a top down view of printed circuit board, according to some embodiments.

In some embodiments, the alignment pins 208 are not electrically coupled to any components within the packaged component 200. However, in some embodiments, the alignment pins 208 may be electrically coupled one or more components or circuits within the packaged component 200. For example, the alignment pins 208 may be coupled to a ground connection within the packaged component 200 to provide a ground connection with an external ground, such as a ground connection on a PCB, such as PCB 300.

Figure 5:
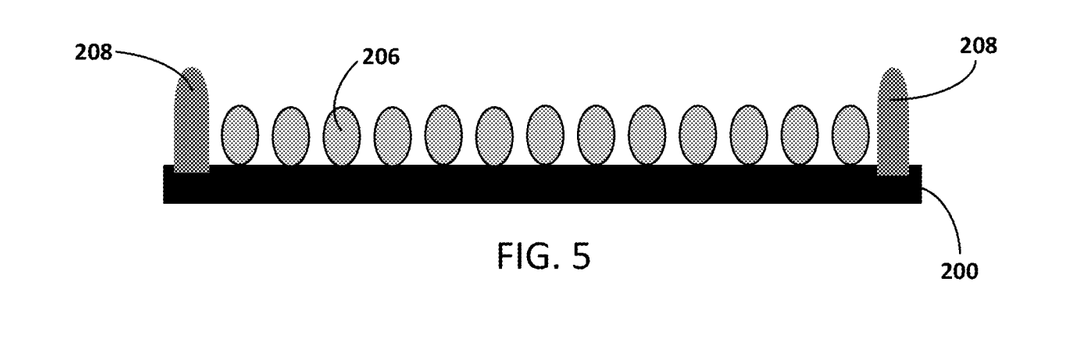
FIG. 5 is a side view of the integrated circuit component of FIG. 2, according to some embodiments, according to some embodiments.

In some embodiments, the alignment pins 208 may have a tapered portion or shape. For example, the alignment pins 208 may have a conical taper. For example, turning now to FIG. 5, a side view of the packaged component 200 is shown, according to some embodiments. As shown in FIG. 5, the alignment pins 208 have a tapered portion 500, shown as a conical taper. In one example, the tapered portion 500 is a right circular cone (e.g. has a 45-degree taper). However, in other examples, the tapered portion 500 may have more than a 45-degree taper, or less than a 45-degree taper. In some examples, the tapered portion 500 may have a rounded or circular taper, or other tapered shape as required for a given application. The alignment pins 208 may have a length of 5 mm. However, lengths of more than 5 mm or less than 5 mm may also be used as appropriate for a required application. The tapered portion 500 may aid in correcting an alignment between the packaged component 200 and the PCB 300 as described in more detail below.

The alignment pins 208 are configured to interface with corresponding receptacles on a connection pad, such as pad 302, of a PCB. Returning now to FIG. 3, alignment receptacles 306 are shown on the pads 302, which correspond with alignment pins 208 on associated packaged components 200. In some instances, the alignment receptacles 306 are referred to as self-correcting alignment receptacles. In some embodiments, the alignment receptacles 306 are electronically isolated from other components or portions of the PCB 300. However, in other embodiments, the alignment receptacles 306 may be electrically coupled to a ground or other electrical connection within the PCB 300, such that an electrical connection may be created when an alignment pin 208 comes into contact with a portion of the alignment receptacle 306.

Figure 6:
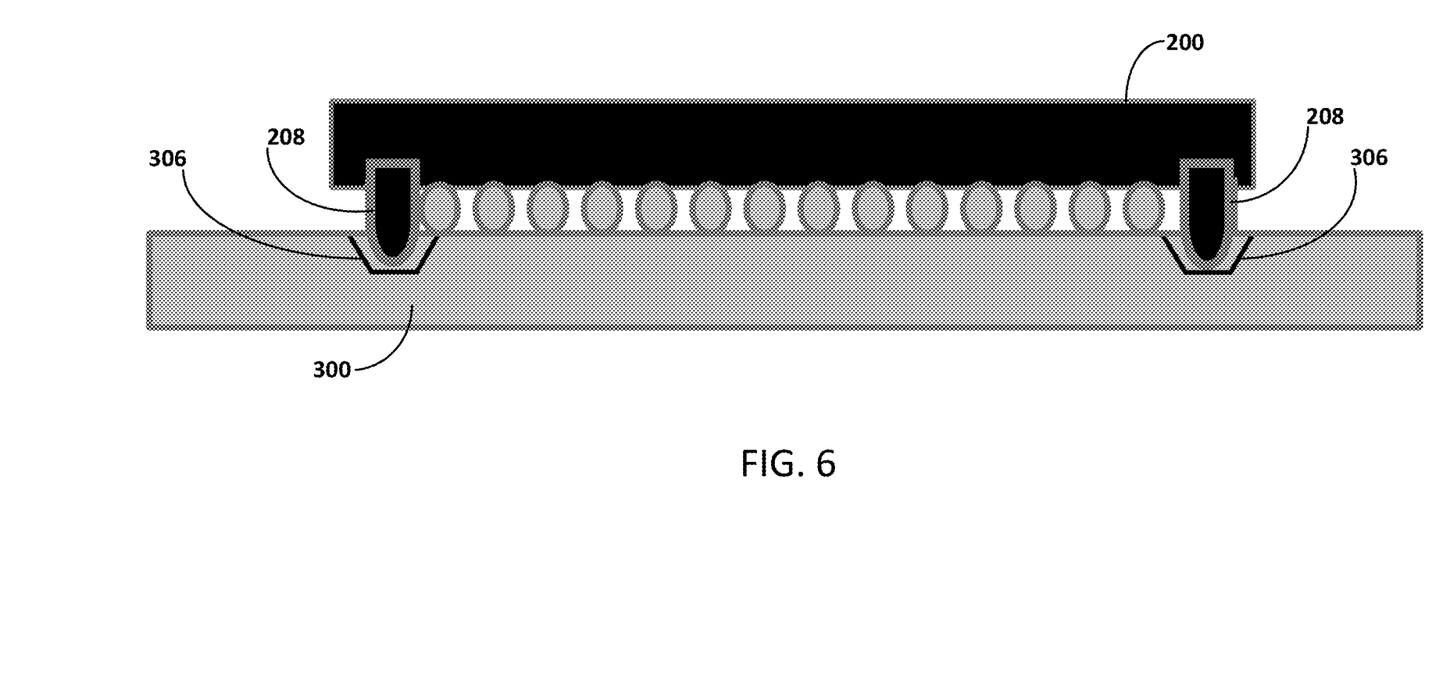
FIG. 6 is a side cross-sectional view of the integrated circuit of FIG. 2 and the printed circuit board of FIG. 3, according to some embodiments.

In some embodiments, the alignment receptacles 306 may have a tapered shape that is generally complementary to the tapered portion 500 of the alignment pins 208 (i.e. an inverse shape of the tapered portion 500). Thus, when the packaged component 200 is placed on the pads 302, the alignment pins 208 are received in the alignment receptacles 306. Turning now to FIG. 6, a cross-sectional view of the packaged component 200 and the PCB 300 is shown, according to some embodiments. As shown in FIG. 6, the alignment pins 208 are aligned with, and inserted into, the alignment receptacles 306.

Figure 7:
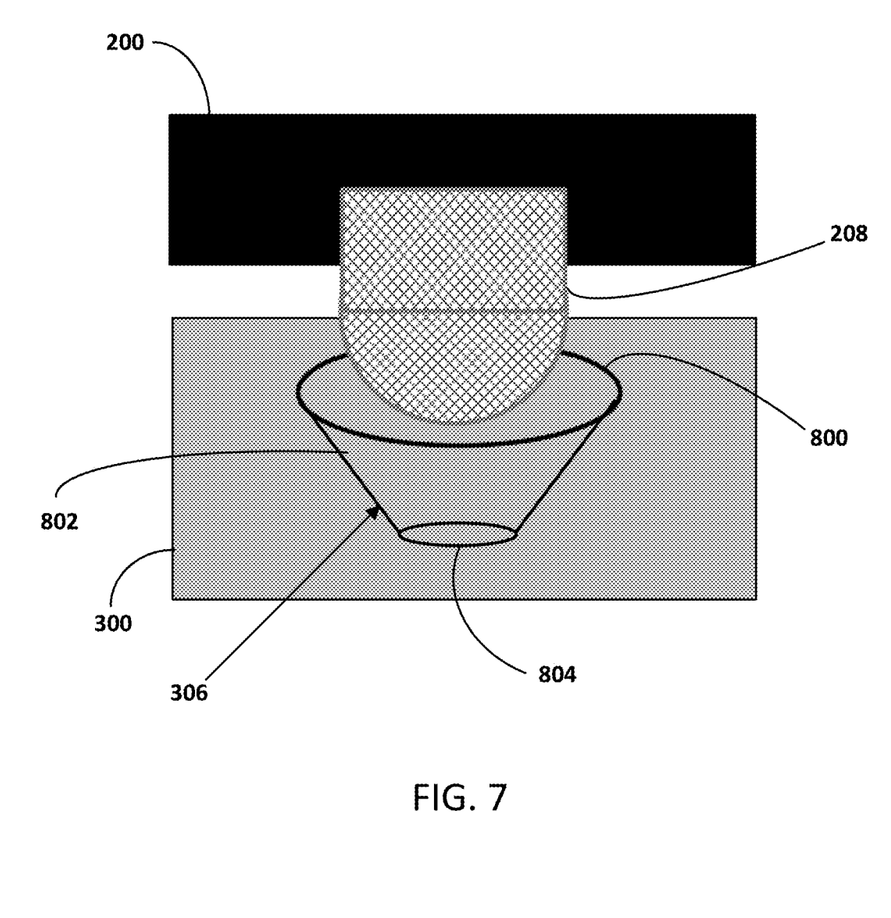
FIG. 7 is a magnified view of an interface between an alignment pin of the integrated circuit component of FIG. 2 and an alignment receptacle of the printed circuit board of FIG. 3, according to some embodiments.

FIG. 7 show a magnified view of the interface between the alignment pins 208 and the alignment receptacles 306. As shown in FIG. 7, an opening 700 of the alignment receptacle 306 may have a larger diameter than a diameter of the alignment pin 208. For example, the opening 700 may be 10% larger than the diameter of the alignment pin 208. However, values of more than 10% or less than 10% are also contemplated. The difference between the opening 700 and a diameter of the alignment pin 208 may allow for the alignment pin 208 (and therefore the packaged component 200) to be misaligned by at least 0.1 mm during placement. As the distance between the packaged component 200 and the PCB 300 decreases, such as during a reflow process where the weight of the packaged component 200 moves the packaged component closer to the PCB 300 as the solder balls reflow, the interface between the tapered portion 500 and a corresponding taper 802 of the alignment receptacle 306 will bring the packaged component 200 into alignment with the pad 302. As shown in FIGS. 6 and 7, the alignment receptacle 306 does not penetrate completely through the PCB 300 and terminates at an end portion 804. Upon completion of the reflow process, a tip 706 of the alignment pin 208 comes into contact with, or approaches, the end portion 804 to ensure alignment. Thus, as the solder reflows moving the packaged component 200 closer to the PCB 300, any misalignment during placement is automatically corrected due to the interface between the alignment pin 208 and the alignment receptacle 306.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain implementations and should in no way be construed to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:
1. A data storage device, comprising:
a substrate; and
an integrated circuit package including:
a grid array, and at least one self-correcting alignment pin having a tapered portion; and wherein the substrate includes a connection pad interfacing with the integrated circuit package, the connection pad including at least one self-correcting alignment receptacle receiving the at least one self-correcting alignment pin, wherein the self-correcting alignment receptacle has a tapered shape complementary to a shape of the tapered portion of the at least one self-correcting alignment pin, and wherein the self-correcting alignment receptacle does not penetrate completely through the substrate.

2. The data storage device of claim 1, wherein the tapered portion is a circular cone taper.

3. The data storage device of claim 1, wherein the self-correcting alignment pin is received within the self-correcting alignment receptacle such that an alignment between the integrated circuit package and the connection pad is maintained during a reflow operation.

4. The data storage device of claim 1, wherein the grid array comprises a ball grid array.

5. The data storage device of claim 1, wherein the self-correcting alignment pin is electrically connected to the self-correcting alignment receptacle.

6. The data storage device of claim 1, wherein the self-correcting alignment receptacle is electrically coupled to a ground potential connection of the substrate.

7. An integrated circuit device, comprising:
a package having a quadrilateral shape;
a grid array positioned on a first side of the package, the grid array including a plurality of connection points;
a first self-correcting alignment pin on the first side of the package; and
a second self-correcting alignment pin on the first side of the package,
wherein the first self-correcting alignment pin and the second self-correcting alignment pin each have a conically shaped tapered portion; and
wherein the first self-correcting alignment pin and the second self-correcting alignment pin are positioned opposite the grid array along a diagonal axis bisecting the package, and
wherein the integrated circuit device is coupled to a substrate, the substrate comprising a connection pad configured to interface with the integrated circuit device; and
wherein the first self-correcting alignment pin and the second self-correcting alignment pin interface with a first self-correcting alignment receptacle and a second self-correcting alignment receptacle, respectively, of the connection pad,
wherein the first self-correcting alignment receptacle and the second self-correcting alignment receptacle have a tapered shape complementary to the conically shaped tapered portion of the first self-correcting alignment pin and the second self-correcting alignment pin, and
wherein the first self-correcting alignment and the second self-correcting alignment receptacles do not penetrate completely through the substrate.

8. The integrated circuit device of claim 7, wherein the first self-correcting alignment pin is received within the first self-correcting alignment receptacle and the second self-correcting alignment pin is received within the second self-correcting alignment receptacle such that the integrated circuit device maintains an alignment with the connection pad.

9. The integrated circuit device of claim 7, wherein the grid array is one of a ball grid array, a line grid array, or a pin grid array.

10. The integrated circuit device of claim 7, wherein the conically shaped tapered portion is a right circular cone tapered shape.

11. An electronic assembly, comprising:
a printed circuit board including a connection pad; and
an integrated circuit package having a grid array;
wherein the integrated circuit package includes a first self-correcting alignment pin and a second self-correcting alignment pin that have a tapered portion, and
wherein the connection pad is interfaced with the grid array, the connection pad including a first self-correcting alignment receptacle receiving the first self-correcting alignment pin and a second self-correcting alignment receptacle receiving the second self-correcting alignment pin, and
wherein the first self-correcting alignment pin is received within the first self-correcting alignment receptacle and the second self-correcting alignment pin is received within the second self-correcting alignment receptacle such that the grid array integrated circuit package maintains an alignment with the connection pad,
wherein the first self-correcting alignment receptacle includes a tapered shape complementary with the tapered portion of the first self-correcting alignment pin and the second self-correcting alignment receptacle includes a tapered shape complementary with the tapered portion of the second self-correcting alignment pin;
and wherein the first self-correcting alignment receptacle and the second self-correcting alignment receptacle do not penetrate completely through a substrate of the printed circuit board.

12. The electronic assembly of claim 11, wherein the electronic assembly is a data storage device.

13. The electronic assembly of claim 11, wherein the tapered portion is a circular cone shaped tapered portion.

14. The electronic assembly of claim 11, wherein the first self-correcting alignment pin and the second self-correcting alignment pin are positioned opposite the grid array along a diagonal axis bisecting the package.

15. The electronic assembly of claim 11, wherein at least one of:
the first self-correcting alignment pin is electrically connected to the first self-correcting alignment receptacle, or
the second self-correcting alignment pin is electrically connected to the second self-correcting alignment receptacle.

16. The electronic assembly of claim 11, wherein the grid array is one of a ball grid array, a line grid array, or a pin grid array.

* * * * *